United States Patent
Merrill (10) Patent No.: US 7,061,315 B2
(45) Date of Patent: Jun. 13, 2006

(54) AUXILIARY AMPLIFIER NETWORK

(75) Inventor: Jeffrey C. Merrill, Manlius, NY (US)

(73) Assignee: Anaren, Inc., E. Syracuse, NY (US)

( * ) Notice: Subject to any disclaimer, the term of this patent is extended or adjusted under 35 U.S.C. 154(b) by 58 days.

(21) Appl. No.: 10/862,800

(22) Filed: Jun. 7, 2004

(65) Prior Publication Data
US 2005/0225385 A1    Oct. 13, 2005

Related U.S. Application Data (60) Provisional application No. 60/476,599, filed on Jun. 6, 2003.

(51) Int. Cl.
*H03F 3/68* (2006.01)

(52) U.S. Cl. .................. 330/124 D; 330/51; 330/124 R (58) Field of Classification Search ............... 330/51, 330/124 R, 124 D, 207 P, 295, 298
See application file for complete search history.

(56) References Cited

U.S. PATENT DOCUMENTS

| | | | | |
|---|---|---|---|---|
| 4,965,530 A | * | 10/1990 | Katz | ............ 330/295 |
| 6,844,793 B1 | * | 1/2005 | Kenington | ............ 333/101 |

* cited by examiner

*Primary Examiner*—Khanh Van Nguyen
(74) *Attorney, Agent, or Firm*—Robert J. Sinnema; Bond, Schoeneck & King, PLLC (57) ABSTRACT

A high frequency amplifier network is provided in which an auxiliary amplifier is available to replace one of a plurality of primary amplifiers. Alternately, the auxiliary amplifier may operate in parallel with one of a plurality of primary amplifiers.

16 Claims, 3 Drawing Sheets

Fig. 3A $$Zi_{OPEN} = \frac{Zoe + Zoo}{2}$$

$$\theta = \theta$$

Fig. 3B $$Zi_{SHORT} = \frac{2ZoeZoo}{Zoe + Zoo}$$

$$\theta = \theta$$

AUXILIARY AMPLIFIER NETWORK

PRIORITY CLAIM

This application claims priority to U.S. Provisional Application 60/476,599, filed Jun. 6, 2003.

BACKGROUND OF THE INVENTION

1. Field of the Invention

The present invention relates to amplifier networks used in high frequency communication systems such as cellular communication systems.

2. Description of Prior Art

In communication systems, high frequency signals often require an increase in magnitude. This increase can be achieved by adding amplifiers designed for this purpose. These amplifiers are placed in series with the path of the signal. Two conditions that can affect the operation of the system employing these amplifiers are amplifier failure and the amplifier reaching its capacity limit.

An exemplary system employing high frequency amplification is a multi-sector cell within a cellular communication system. The most popular implementation of this type of system divides the cell into three sectors. These sectors are treated as independent paths for data traffic to follow. Data intended for radiation into the first sector is delivered to a first antenna through a first amplifier. Similarly, for paths 2 and 3, data intended for radiation into the second (third) sector is delivered to a second (third) antenna through a second (third) amplifier. The first, second and third amplifiers are also called Primary Amplifiers. In this system, if the first amplifier fails, the data cannot be delivered to the first antenna. The same is true for failure of the second amplifier or third amplifier, in the second and third paths, respectively.

A well known solution to this problem of an amplifier failure is to add an additional amplifier to the system. This amplifier is called an Auxiliary Amplifier. Such a network will be designed to allow the Auxiliary Amplifier to be switched into the position of any of the Primary Amplifiers while simultaneously switching out that primary amplifier. When a Primary Amplifier failure is detected, a command is sent to the network to switch in the Auxiliary Amplifier.

In one specific method of this solution of protecting against amplifier failure, a divider is used to split a signal into at least two paths, and a combiner to combine the at least two paths into a single transmission line. According to this method, each path has a primary amplifier, and each path has an auxiliary amplifier. The input to each auxiliary amplifier is normally shunted to ground through a switch, but in case a primary amplifier fails, the switch can be activated to shunt the failed amplifier's input to ground, which activates the auxiliary amplifier.

According to this method, multiple paths may be used to limit the effect of amplifier failure in any one path, but each auxiliary amplifier is associated with only one primary amplifier. Thus, a single auxiliary amplifier provides redundancy to only one primary amplifier and one signal path. Given the service reliability of amplifiers, it is inefficient to provide an auxiliary amplifier for each primary amplifier. In addition, it is occasionally useful to increase the amplifier capacity for a specific path by employing both a primary and auxiliary amplifier. This method does not allow the primary and auxiliary amplifiers to be employed together.

What is needed is an auxiliary amplifier circuit in which a single auxiliary amplifier can be switched to provide redundancy for a plurality of primary amplifiers.

What is also needed is an auxiliary amplifier circuit in which an auxiliary amplifier can cooperate with a primary amplifier to increase amplifier capacity for a circuit path.

OBJECTS AND ADVANTAGES

It is therefore an object and advantage of the present invention to provide an auxiliary amplifier circuit in which one auxiliary amplifier can be switched into a circuit to provide redundancy for one or more primary amplifiers.

It is therefore a further object and advantage of the present invention to provide an auxiliary amplifier circuit in which an auxiliary amplifier can cooperate with a primary amplifier to increase amplifier capacity for a circuit path.

SUMMARY OF THE INVENTION

In accordance with the foregoing objects and advantages, the present invention provides a high frequency amplifier network in which an auxiliary amplifier is available to replace one of a plurality of primary amplifiers. Alternately, the auxiliary amplifier may operate in parallel with one of a plurality of primary amplifiers.

BRIEF DESCRIPTION OF THE DRAWINGS

The present invention will be more fully understood and appreciated by reading the following Detailed Description in conjunction with the accompanying drawings, in which.

DETAILED DESCRIPTION

A network according to a first embodiment of the invention is referred to as an "N+1" network or "N+1 Cold Standby". Here, "Cold Standby" refers to the normal status of the Auxiliary Amplifier (cold meaning not operating) and "N+1" refers to the number of amplifiers required (N is the number of primary amplifiers). This system requires one more amplifier than would be required without this network.

In systems where the data traffic changes over time and from sector-to-sector, it would be beneficial to have the ability to increase the amplifier capacity in any one sector at any given time. Now that the Auxiliary amplifier has been introduced into the system, a second (different) network can be designed to switch this Auxiliary Amplifier into the system not only in place of any Primary Amplifier but also in parallel with any one of the Primary Amplifiers. The amplifier capacity of any single path, will be increased, by having two amplifiers in parallel in that path. This network will provide redundancy and capacity enhancement.

A network with parallel auxiliary amplifier capability is referred to as an "N+1 Hot Standby" network. Here, "Hot Standby" refers to the ability to use the Auxiliary Amplifier even when all of the Primary Amplifiers are operating correctly. "N+1" still refers to the number of amplifiers required (N is the number of primary amplifiers). Again, this system requires one more amplifier than would be required without this network.

Both of these circuits are relatively narrow band solutions to these networks. However, the bandwidth achieved is more than adequate for the targeted cellular/wireless communications bands of interest (normally less than 60 MHz wide in the 800 MHz and 2000 MHz regions).

Figure 1:
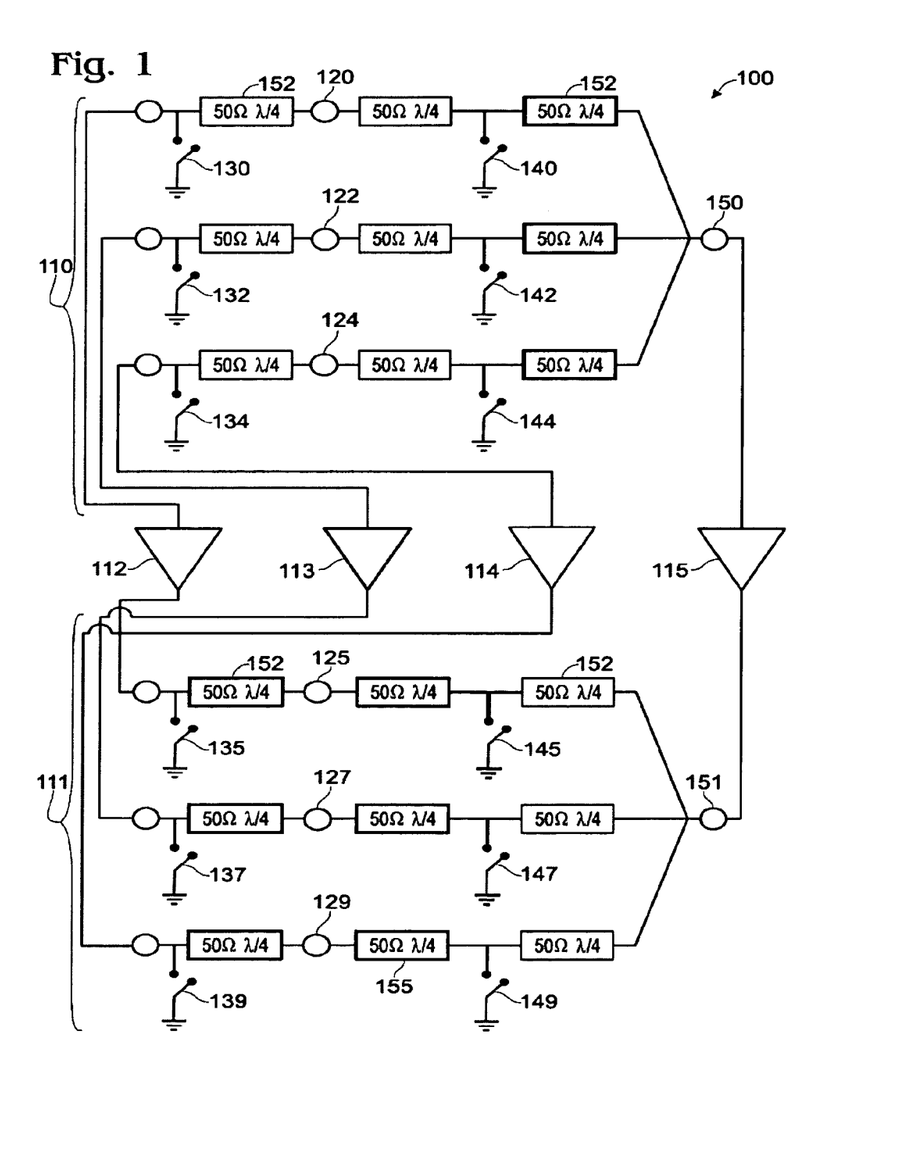
FIG. 1 is a schematic of the invention according to a first embodiment.

Referring now to the drawings, wherein like reference numerals refer to like parts throughout, there is seen in FIG. 1 an auxiliary amplifier network 100 according to a first embodiment of the invention, comprising primary amplifiers 112, 113, 113, an auxiliary amplifier 115, input network 110 and output network 111. Input network 110 comprises a plurality of network input ports 120, 122, 124, input shunt switches 130, 132, 134, 140, 142, 144, auxiliary amplifier input port 150, and a plurality of transmission lines 152. Output network 111 comprises a plurality of network output ports 125, 127, 129, output shunt switches 135, 137, 139, 145, 147, 149, auxiliary amplifier output port 151, and a plurality of transmission lines 152. For illustrative purposes only, FIG. 1 depicts an auxiliary amplifier network having three primary amplifiers. The present invention, however, is not limited to a specific number of amplifiers as its principles are applicable to auxiliary amplifier networks having at least one primary amplifier.

Input network 110 and output network 111 are schematically the same and are mirrored around the amplifiers 112, 113, 114. Like hardware could be used for both input network 110 and output network 111. Those skilled in the art will recognize that the output network 111 will be required to handle more power which may higher rated components than would be necessary for the input network 110.

There are four conditions of operation, which are detailed as follows.

In condition 1 (Normal Operation), data for sector 1 is applied to network input port 120, amplified by primary amplifier 112 and delivered to network output port 125. Data for sector 2 is applied to network input port 122, amplified by primary amplifier 113 and delivered to network output port 127. Data for sector 3 is applied to network input port 124, amplified by primary amplifier 114 and delivered to network output port 129.

On the input side, input shunt switches 130, 132 and 134 are all open allowing a direct 50Ω path from the network input ports 120, 122 124 to primary amplifiers 112, 113, 114, respectively. Input shunt switches 140, 142 and 144 are all closed (shorted to ground) which presents an open at each of the network input ports 120, 122, 124 and at the auxiliary amplifier input port 150. The open is due to the transformation through the λ/4 length of transmission lines 152 between the input shunt switches 140, 142 and 144 and their respective input ports 120, 122, 124.

On the output side, output shunt switches 135, 137 and 139 are all open, providing a direct 50Ω path from the output of each primary amplifier 112, 113, 114 to the respective network output ports 125, 127, 129. Output shunt switches 145, 147 and 149 are all closed (shorted to ground) which presents an open at each of the network output ports 125, 127, 129 and at the Auxiliary Amplifier output port 151. Again, the open is due to the transformation through the λ/4 length of transmission lines 152 between the output shunt switches 145, 147, 149 and the network output ports 125, 127, 129.

In Condition 2 (Auxiliary Amplifier 115 Replaces Primary Amplifier 112), data for Sector 1 is still applied to network input port 120 and delivered to network output port 125 but is redirected through the Auxiliary Amplifier 115. In this case input shunt switch 130 is closed (shorted to ground) presenting an open at network input port 120 and isolating the input of Primary Amplifier 112 from the network. At the same time input shunt switch 140 is opened providing a 50Ω path between network input port 120 and the Auxiliary Amplifier input port 150. Input shunt switches 132 and 134 are open and input shunt switches 142 and 144 are closed (shorted to ground), which will present opens at network input ports 122 and 124 as well as at the Auxiliary Amplifier input port 150. Data for sectors 2 and 3 continues in the Normal mode as described above.

On the output side, output shunt switch 135 is also closed, presenting an open at network output port 125 and isolating the output of Primary Amplifier 112 from the network. Output shunt switch 145 is opened, providing a 50Ω path between the Auxiliary Amplifier output port 151 and network output port 125. Output shunt switches 137 and 139 are open and output shunt switches 147 and 149 are closed (shorted to ground), which will present opens at network output ports 127 and 129 as well as at the Auxiliary Amplifier output port 151.

In Condition 3(Auxiliary Amplifier 115 Replaces Primary Amplifier 113) data for Sector 2 is still applied to network input port 122 and delivered to network output port 127 but is redirected through the Auxiliary Amplifier 115. In this case input shunt switch 132 is closed (shorted to ground), presenting an open at network input port 122 and isolating the input of Primary Amplifier 113 from the network. At the same time input shunt switch 142 is opened providing a 50Ω path between network input port 122 and the Auxiliary Amplifier input port 150. Input shunt switches 130 and 134 are open and input shunt switches 140 and 144 are closed (shorted to ground), which will present opens at network input ports 120 and 124 as well as at the Auxiliary Amplifier input port 150. Data for sectors 1 and 3 continues in the Normal mode as described above.

On the output side, output shunt switch 137 is also closed presenting an open at network output port 127 and isolating the output of Primary Amplifier 113 from the network. output shunt switch 147 is opened providing a 50Ω path between the Auxiliary Amplifier output port 151 and network output port 127. Output shunt switches 135 and 139 are open and output shunt switches 145 and 149 are closed (shorted to ground), which will present opens at network output ports 125 and 129 as well as at the Auxiliary Amplifier output port 151.

In Condition 4 (Auxiliary Amplifier 115 Replaces Primary Amplifier 114), data for Sector 3 is still applied to network input port 124 and delivered to network output port 129 but is redirected through the Auxiliary Amplifier 115. In this case input shunt switch 134 is closed (shorted to ground) presenting an open at network input port 124 and isolating the input of Primary Amplifier 114 from the network. At the same time input shunt switch 144 is opened providing a 50Ω path between network input port 124 and the Auxiliary Amplifier input port 150. Input shunt switches 130 and 132 are open and input shunt switches 140 and 142 are closed (shorted to ground), which will present opens at network input ports 120 and 122 as well as at the Auxiliary Amplifier input port 150. Data for sectors 1 and 2 continues in the Normal mode as described above.

On the output side, output shunt switch 139 is also closed, presenting an open at network output port 129 and isolating the output of Primary Amplifier 114 from the network. Output shunt switch 149 is opened providing a 50Ω path between the Auxiliary Amplifier output port 151 and network output port 129. Output shunt switches 135 and 137 are open and output shunt switches 145 and 147 are closed (shorted to ground), which will present opens at network output ports 125 and 127 as well as at the Auxiliary Amplifier output port 151.

This network is made up of a plurality of 50Ω transmission lines with specific electrical lengths and switches providing ground at specific locations along the transmission lines. When closed, the switches are always shunted (to ground) and never in series with the transmission lines. This proves beneficial for both electrical performance (i.e. insertion loss) and for ease in implementation.

Impedance and electrical lengths as well as the quality of the short circuit connection provided by each shunt switch must be controlled to provide good system impedance match.

Minimum insertion loss is paramount mainly in the output network 111. This will help system efficiency as well thermal issues due to power dissipation.

It is undesirable for data intended for any one sector to be present at the output port for any other sector. It is primarily the quality of grounding at the shunt switches that influences this parameter. It is therefore necessary to isolate these switches by proper grounding.

It can be seen in FIG. 1 that the electrical lengths of the paths through the primary amplifiers 112, 113, 114 are all equal. The electrical length, however, of the path through the auxiliary amplifier 115 is longer due to the extra transmission line required in this path. In most cases it is not a problem to have different path lengths. But there are some cases in which it may be necessary to have all path lengths equal. In these cases extra transmission line segments 152 could be added to the paths through the primary amplifiers to make up for the extra path length in the auxiliary amplifier path. When phase matching is not required, length should not be added as it will only add insertion loss.

The schematic in FIG. 1 shows that the "N+1 Cold Standby" circuit can be achieved very simply with 50Ω transmission lines and shunt switches. This circuit could be built using coaxial cable, printed microstrip, printed stripline, waveguide or any other transmission line architecture.

Figure 2:
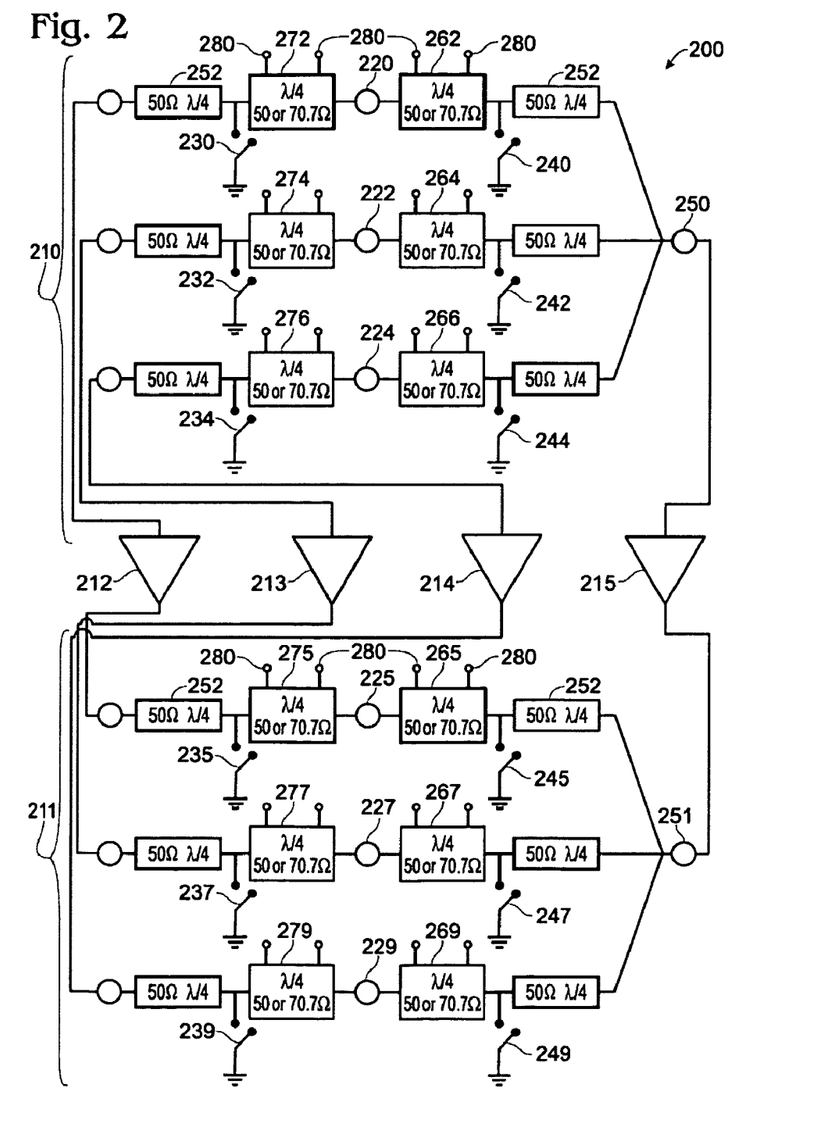
FIG. 2 is a schematic of the invention according to a second embodiment.

In another embodiment, the invention provides a circuit for N+1 hot standby. The schematic diagram of such a circuit, which will offer redundancy and capacity enhancement in a multi-amplifier system is shown in FIG. 2. This capacity enhancement will be achieved by placing the Auxiliary Amplifier 215 in parallel with any one of the primary amplifiers 212, 213, 214 (assuming that the Auxiliary Amplifier 215 is not replacing one of the Primary Amplifiers 212, 213, 214 due to a failure). Again, the input network 210 and output network 211 are schematically the same and are mirrored around the amplifiers. The same hardware could be used for both networks, however the output network 211 will be required to handle more power, which may require components of higher capacity than will be necessary for the input network 210. Input network 210 comprises comprises a plurality of network input ports 220, 222, 224, input shunt switches 230, 232, 234, 240, 242, 244, auxiliary amplifier input port 250, a plurality of transmission lines 252, and switchable transmission lines 262, 264, 266, 272, 274, 276, each comprising two control ports 280. Output network 211 comprises a plurality of network output ports 225, 227, 229, output shunt switches 235, 237, 239, 245, 247, 249, auxiliary amplifier output port 251, a plurality of transmission lines 252, and switchable transmission lines 265, 267, 269, 275, 277, 279, each comprising two control ports 280. For illustrative purposes only, FIG. 2 depicts an auxiliary amplifier network having three primary amplifiers. The present invention, however, is not limited to a specific number of amplifiers as its principles are applicable to auxiliary amplifier networks having at least one primary amplifier.

FIG. 2 shows a "N+1 Hot Standby" circuit comprised of transmission line segments and shunt switches. In this embodiment, however, some of the transmission lines will have to change between two different impedances for optimal performance (a compromise could be made where some other impedance between the two desired impedances is selected, such as the geometric mean, and performance degradation due to this non-ideal condition is accepted). The preferred approach uses coupled line technology as a means of providing switchable impedances. Any realization of backward wave couplers could be applied to this circuit although microstrip and stripline seem to be the best implementation.

This circuit according to this embodiment requires lengths of switchable transmission line that have the ability to change impedance between 50Ω and 70.7Ω to facilitate the 2-way splitting and combining functions. These are the functions required in order to place the Auxiliary Amplifier in parallel with one of the Primary Amplifiers. This "impedance changing" function will be achieved using coupled line circuits 300 (FIGS. 3A, 3B), which act as a λ/4 transmission line that can change impedance when two of the four ports (the control ports 302) are either shorted to ground or left open.

A coupled line structure with the control ports 302 terminated in open circuits (FIG. 3A) and another coupled line structure with the control ports terminated in short circuits (FIG. 3B) are introduced. The "control ports" 302 will always be either shorted to ground or left open. The two remaining ports of each coupler will make up two port networks. Each of these two port networks acts as a piece of transmission line with length θ and impedance $Z_i$ (where the "i" stands for image—this is known as the image impedance).

Figure 3A:
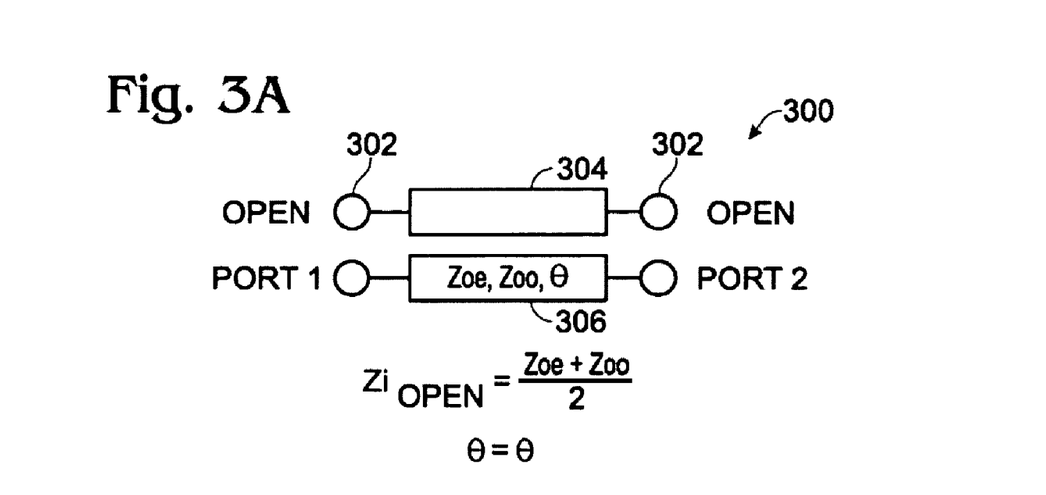
FIG. 3 is a schematic of a detail of the circuit according to the second embodiment.
Figure 3B:
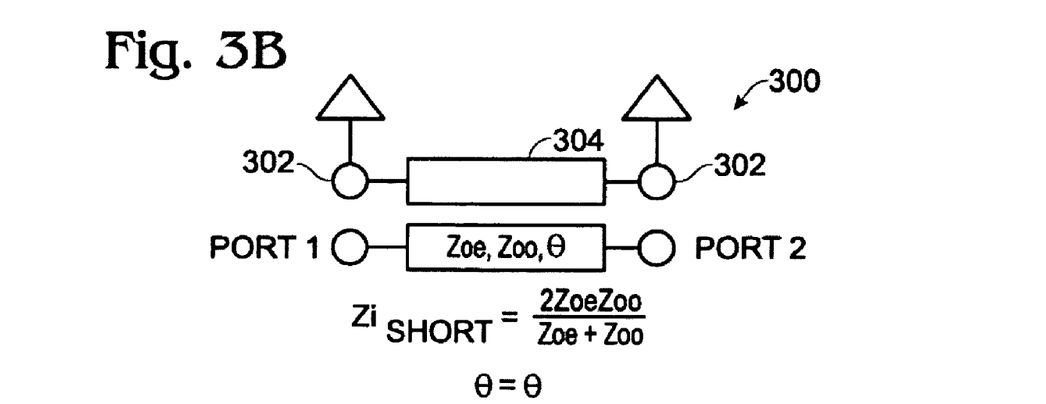

A pair of coupled lines 304, 306 configured as in FIGS. 3A and 3B will act as a piece of transmission line that can take on two different values of characteristic impedance simply by switching between opens and shorts at the control ports 302. It is known from coupler theory that Zoe⇐Zoo. When they are equal, their normalized values are both 1 and no coupling exists. Therefore, $Zi_{open} = Zi_{short}$. It can be shown that for all other cases, where Zoe ∃ Zoo, $Zi_{open}$ will be higher than $Zi_{short}$.

The two required impedances are 50.00Ω and 70.71Ω. Set $Zi_{open}$=70.71 and $Zi_{short}$=50.00Ω. This yields two equations and two unknowns. Solve for Zoe and Zoo, the values required to produce the couplers, as follows:

$$Zi_{open} = 70.71 = \frac{Zoe + Zoo}{2} \quad \text{So: } Zoe = 141.42 - Zoo$$

$$Zi_{short} = 50.00$$
$$= \frac{2ZoeZoo}{Zoe + Zoo}$$
$$= \frac{2(141.42 - Zoo)Zoo}{(141.42 - Zoo) + Zoo}$$
$$= \frac{282.84Zoo - 2(Zoo)^2}{141.42}$$

rearranging:

$$0 = 2(Zoo)^2 - 282.84(Zoo) + (141.42 \cdot 50)$$

Solving this quadratic:

$$\frac{-(-282.84) \pm \sqrt{(-282.84)^2 - (4 \times 2 \times (141.42 \times 50))}}{2 \times 2}$$

The two solutions to this quadratic equation are the even and odd mode impedances required to produce the coupler:

Zoe=108.98Ω, Zoo=32.44Ω

Which results in: Cplg=5.3 dB, Z0=59.5Ω

If a coupler is built to the above parameters, it will act as a piece of transmission line that is λ/4 long and has an impedance of 50Ω when the two control ports 302 are short circuited and 70.7Ω when the two control ports 302 are open circuited.

With this switchable impedance function available, the desired circuit function can now be achieved through implementation of the schematic shown in FIG. 2. There are seven conditions of operation, which are detailed in the following sections.

In Condition 1 (Normal Operation), data for Sector 1 is applied to network input port 220, amplified by Primary Amplifier 212 and delivered to network output port 225. Data for sector 2 is applied to network input port 222, amplified by primary amplifier 213 and delivered to network output port 227. Data for sector 3 is applied to network input port 224, amplified by primary amplifier 214 and delivered to network output port 227.

Switch positions and transmission line impedance selections are summarized in Table 1.

TABLE 1

| Input Circuit | Position | Input Circuit | Value [Ω] |
|---|---|---|---|
| Switch 230 | Open | Transmission Line 272 | 50 |
| Switch 232 | Open | Transmission Line 262 | 70.7 |
| Switch 234 | Open | Transmission Line 274 | 50 |
| Switch 240 | Closed | Transmission Line 264 | 70.7 |
| Switch 242 | Closed | Transmission Line 276 | 50 |
| Switch 244 | Closed | Transmission Line 266 | 70.7 |
| Output Circuit | | Output Circuit | |
| Switch 235 | Open | Transmission Line 275 | 50 |
| Switch 237 | Open | Transmission Line 265 | 70.7 |
| Switch 239 | Open | Transmission Line 277 | 50 |
| Switch 245 | Closed | Transmission Line 267 | 70.7 |
| Switch 247 | Closed | Transmission Line 279 | 50 |
| Switch 249 | Closed | Transmission Line 269 | 70.7 |

On the input side, input shunt switches 230, 232 and 234 are all open allowing a direct 50Ω path from the network inputs ports 220, 222, 224 to the Primary Amplifiers 212, 213, 214. Input shunt switches 240, 242, 244 are all closed (shorted to ground), which presents an open at each of the network input ports 220, 222, 224 and at the Auxiliary Amplifier input port 250. The open is due to the transformation through the λ/4 length of switchable transmission lines 262, 264, 266 between the input shunt switches 240, 242, 244 and the network input ports 220, 222, 224.

On the output side, output shunt switches 235, 237 and 239 are all open, providing a direct 50Ω path from the output of Primary Amplifiers 212, 213, 214 to network output ports 225, 227, 229. Output shunt switches 245, 247 and 249 are all closed (shorted to ground), which presents an open at each of the network output ports 225, 227, 229 and at the Auxiliary Amplifier output port 251. Again, the open is due to the transformation through the λ/4 length of switchable transmission lines 265, 267, 269 between the output shunt switches 245, 247, 249 and the network output ports 225, 227, 229.

The selection of 70.7Ω for some paths in both the input network 210 and output network 211 will help to improve bandwidth. The switchable transmission lines where 70.7Ω is selected are not part of the signal path for condition 1 but are acting as transformers to convert the short circuit to an open circuit. The higher the impedance of this transmission line transformer, the wider the bandwidth. In other conditions of operation these switchable transmission lines will be part of the main signal path and will require the impedance to be switched between 50 and 70.7Ω. Since this switching is a part of the circuit due to these requirements, it makes sense to take advantage of this function to increase bandwidth.

In Condition 2 (Auxiliary Amplifier 215 Replaces Primary Amplifier 212), data for Sector 1 is still applied to network input port 220 and delivered to network output port 225 but is redirected through the Auxiliary Amplifier 215. Data in sectors 2 and 3 continues in the Normal mode as described above. Switch positions and transmission line impedance selections are summarized in table 2.

TABLE 2

| Input Circuit | Position | Input Circuit | Value [Ω] |
|---|---|---|---|
| Switch 230 | Closed | Transmission Line 272 | 70.7 |
| Switch 232 | Open | Transmission Line 262 | 50 |
| Switch 234 | Open | Transmission Line 274 | 50 |
| Switch 240 | Open | Transmission Line 264 | 70.7 |
| Switch 242 | Closed | Transmission Line 276 | 50 |
| Switch 244 | Closed | Transmission Line 266 | 70.7 |
| Output Circuit | | Output Circuit | |
| Switch 235 | Closed | Transmission Line 275 | 70.7 |
| Switch 237 | Open | Transmission Line 265 | 50 |
| Switch 239 | Open | Transmission Line 277 | 50 |
| Switch 245 | Open | Transmission Line 267 | 70.7 |
| Switch 247 | Closed | Transmission Line 279 | 50 |
| Switch 249 | Closed | Transmission Line 269 | 70.7 |

In this case input shunt switch 230 is closed (shorted to ground), presenting an open at network input port 220 and isolating the input of Primary Amplifier 212 from the network. Transmission line 272 is changed to 70.7Ω for the same reason as described above. At the same time input shunt switch 240 is opened and transmission line 262 is switched to 50Ω providing a 50Ω path between network input port 220 and the Auxiliary Amplifier input port 250. Input shunt switches 232 and 234 are open and input shunt switches 242 and 244 are closed (shorted to ground), which will present opens at network input ports 222 and 224 as well as at the Auxiliary Amplifier input port 250.

On the output side, output shunt switch 235 is closed presenting, an open at network output port 225 and isolating the output of Primary Amplifier 212 from the network. Transmission line 275 is changed to 70.7Ω for the same reason as described above. Output shunt switch 245 is opened and transmission line 265 is switched to 50Ω providing a 50Ω between path the Auxiliary Amplifier output port 251 and network output port 225. Output shunt switches 237 and 239 are open and output shunt switches 247 and 249 are closed (shorted to ground), which will present opens at network output ports 227 and 229 as well as at the Auxiliary Amplifier output port 251.

In Condition 3 (Auxiliary Amplifier 215 replaces primary amplifier 213), data for Sector 2 is still applied to network input port 222 and delivered to network output port 227 but is redirected through the Auxiliary Amplifier 215. Data for sectors 1 and 3 continues in the Normal mode as described above. Switch positions and transmission line impedance selections are summarized in table 3.

TABLE 3

| Input Circuit | Position | Input Circuit | Value [Ω] |
|---|---|---|---|
| Switch 230 | Open | Transmission Line 272 | 50 |
| Switch 232 | Closed | Transmission Line 262 | 70.7 |
| Switch 234 | Open | Transmission Line 274 | 70.7 |
| Switch 240 | Closed | Transmission Line 264 | 50 |
| Switch 242 | Open | Transmission Line 276 | 50 |
| Switch 244 | Closed | Transmission Line 266 | 70.7 |
| Output Circuit | | Output Circuit | |
| Switch 235 | Open | Transmission Line 275 | 50 |
| Switch 237 | Closed | Transmission Line 265 | 70.7 |
| Switch 239 | Open | Transmission Line 277 | 70.7 |
| Switch 245 | Closed | Transmission Line 267 | 50 |
| Switch 247 | Open | Transmission Line 279 | 50 |
| Switch 249 | Closed | Transmission Line 269 | 70.7 |

In this case input shunt switch 232 is closed (shorted to ground), presenting an open at network input port 222 and isolating the input of Primary Amplifier 213 from the network. Transmission line 274 is changed to 70.7Ω for the same reason as described above. At the same time input shunt switch 242 is opened and transmission line 264 is switched to 50Ω providing a 50Ω path between network input port 222 and the Auxiliary Amplifier input port 250. Input shunt switches 230 and 234 are open and input shunt switches 240 and 244 are closed (shorted to ground), which will present opens at network input ports 220 and 224 as well as at the Auxiliary Amplifier input port 250.

On the output side, output shunt switch 237 is closed presenting an open at network output port 227 and isolating the output of Primary Amplifier 213 from the network. Transmission line 277 is changed to 70.7Ω for the same reason as described above. Output shunt switch 247 is opened and transmission line 267 is switched to 50Ω providing a 50Ω between path the Auxiliary Amplifier output port 251 and network output port 227. Output shunt switches 235 and 239 are open and output shunt switches 245 and 249 are closed (shorted to ground), which will present opens at network output ports 225 and 229 as well as at the Auxiliary Amplifier output port 251.

In Condition 4 (auxiliary amplifier 215 replaces primary amplifier 214), data for Sector 3 is still applied to network input port 224 and delivered to network output port 229 but is redirected through the Auxiliary Amplifier 215. Data in sectors 1 and 2 continues in the Normal mode as described above. Switch positions and transmission line impedance selections are summarized in table 4.

TABLE 4

| Input Circuit | Position | Input Circuit | Value [Ω] |
|---|---|---|---|
| Switch 230 | Open | Transmission Line 272 | 50 |
| Switch 232 | Open | Transmission Line 262 | 70.7 |
| Switch 234 | Closed | Transmission Line 274 | 50 |
| Switch 240 | Closed | Transmission Line 264 | 70.7 |
| Switch 242 | Closed | Transmission Line 276 | 70.7 |
| Switch 244 | Open | Transmission Line 266 | 50 |
| Output Circuit | | Output Circuit | |

TABLE 4-continued

| Switch 235 | Open | Transmission Line 275 | 50 |
|---|---|---|---|
| Switch 237 | Open | Transmission Line 265 | 70.7 |
| Switch 239 | Closed | Transmission Line 277 | 50 |
| Switch 245 | Closed | Transmission Line 267 | 70.7 |
| Switch 247 | Closed | Transmission Line 279 | 70.7 |
| Switch 249 | Open | Transmission Line 269 | 50 |

In this case input shunt switch 234 is closed (shorted to ground) presenting an open at network input port 224 and isolating the input of Primary Amplifier 214 from the network. Transmission line 276 is changed to 70.7Ω for the same reason as described above. At the same time input shunt switch 244 is opened and transmission line 266 is switched to 50Ω providing a 50Ω path between network input port 224 and the Auxiliary Amplifier input port 250. Input shunt switches 230 and 232 are open and input shunt switches 240 and 242 are closed (shorted to ground), which will present opens at network input ports 220 and 222 as well as at the Auxiliary Amplifier input port 250.

On the output side, output shunt switch 239 is closed presenting an open at network output port 229 and isolating the output of Primary Amplifier 214 from the network. Transmission line 279 is changed to 70.7Ω for the same reason as described above. Output shunt switch 249 is opened and transmission line 269 is switched to 50Ω providing a 50Ω between path the Auxiliary Amplifier output port 251 and network output port 229. Output shunt switches 235 and 237 are open and output shunt switches 245 and 247 are closed (shorted to ground), which will present opens at network output ports 225 and 227 as well as at the Auxiliary Amplifier output port 251.

In Condition 5 (Auxiliary Amplifier in parallel with primary amplifier 212), data for Sector 1 is still applied to network input port 220 and delivered to network output port 225. The signal is split and amplified by both Primary Amplifier 212 and the Auxiliary Amplifier 215. Data in sectors 2 and 3 continues in the Normal mode as described above. Switch positions and transmission line impedance selections are summarized in table 5.

TABLE 5

| Input Circuit | Position | Input Circuit | Value [Ω] |
|---|---|---|---|
| Switch 230 | Open | Transmission Line 272 | 70.7 |
| Switch 232 | Open | Transmission Line 262 | 70.7 |
| Switch 234 | Open | Transmission Line 274 | 50 |
| Switch 240 | Open | Transmission Line 264 | 70.7 |
| Switch 242 | Closed | Transmission Line 276 | 50 |
| Switch 244 | Closed | Transmission Line 266 | 70.7 |
| Output Circuit | | Output Circuit | |
| Switch 235 | Open | Transmission Line 275 | 70.7 |
| Switch 237 | Open | Transmission Line 265 | 70.7 |
| Switch 239 | Open | Transmission Line 277 | 50 |
| Switch 245 | Open | Transmission Line 267 | 70.7 |
| Switch 247 | Closed | Transmission Line 279 | 50 |
| Switch 249 | Closed | Transmission Line 269 | 70.7 |

In this case input shunt switch 240 is open and transmission lines 272 and 262 are both set to 70.7Ω. With these settings, a signal applied to network input port 220 will be equally split between the paths leading to Primary Amplifier 212 and the Auxiliary Amplifier 215 (the circuit is now configured as the common Wilkinson Power Divider without an internal termination resistor). In the output network 211, the circuit is configured to function as a combiner, combining the output of primary amplifier 212 and auxiliary amplifier 215. To achieve this, output shunt switch 245 is open and transmission lines 275 and 265 are both set to 70.7Ω.

In Condition 6 (Auxiliary Amplifier In Parallel With Primary Amplifier 213), data for Sector 2 is still applied to network input port 222 and delivered to network output port 227. The signal is split and amplified by both Primary Amplifier 213 and the Auxiliary Amplifier 215. Data in sectors 1 and 3 continues in the Normal mode as described above. Switch positions and transmission line impedance selections are summarized in table 6.

TABLE 6

| Input Circuit | Position | Input Circuit | Value [Ω] |
|---|---|---|---|
| Switch 230 | Open | Transmission Line 272 | 50 |
| Switch 232 | Open | Transmission Line 262 | 70.7 |
| Switch 234 | Open | Transmission Line 274 | 70.7 |
| Switch 240 | Closed | Transmission Line 264 | 70.7 |
| Switch 242 | Open | Transmission Line 276 | 50 |
| Switch 244 | Closed | Transmission Line 266 | 70.7 |
| Output Circuit | | Output Circuit | |
| Switch 235 | Open | Transmission Line 275 | 50 |
| Switch 237 | Open | Transmission Line 265 | 70.7 |
| Switch 239 | Open | Transmission Line 277 | 70.7 |
| Switch 245 | Closed | Transmission Line 267 | 70.7 |
| Switch 247 | Open | Transmission Line 279 | 50 |
| Switch 249 | Closed | Transmission Line 269 | 70.7 |

In this case input shunt switch 242 is open and transmission lines 274 and 264 are both set to 70.7Ω. With these settings, a signal applied to network input port 222 will be equally split between the paths leading to Primary Amplifier 213 and the Auxiliary Amplifier 215 (the circuit is now configured as the common Wilkinson Power Divider without an internal termination resistor). In the output network, the circuit is configured to function as a combiner. To achieve this, output shunt switch 247 is open and transmission lines 277 and 267 are both set to 70.7Ω.

In Condition 7 (auxiliary amplifier 215 in parallel with primary amplifier 214), data for Sector 3 is still applied to network input port 224 and delivered to network output port 229. The signal is split and amplified by both Primary Amplifier 214 and the Auxiliary Amplifier 215. Data in sectors 1 and 2 continues in the Normal mode as described above. Switch positions and transmission line impedance selections are summarized in table 7.

TABLE 7

| Input Circuit | Position | Input Circuit | Value [Ω] |
|---|---|---|---|
| Switch 230 | Open | Transmission Line 272 | 50 |
| Switch 232 | Open | Transmission Line 262 | 70.7 |
| Switch 234 | Open | Transmission Line 274 | 50 |
| Switch 240 | Closed | Transmission Line 264 | 70.7 |
| Switch 242 | Closed | Transmission Line 276 | 70.7 |
| Switch 244 | Open | Transmission Line 266 | 70.7 |
| Output Circuit | | Output Circuit | |
| Switch 235 | Open | Transmission Line 275 | 50 |
| Switch 237 | Open | Transmission Line 265 | 70.7 |
| Switch 239 | Open | Transmission Line 277 | 50 |
| Switch 245 | Closed | Transmission Line 267 | 70.7 |
| Switch 247 | Closed | Transmission Line 279 | 70.7 |
| Switch 249 | Open | Transmission Line 269 | 70.7 |

In this case input shunt switch 244 is open and transmission lines 276 and 266 are both set to 70.7Ω. With these settings, a signal applied to network input port 224 will be equally split between the paths leading to Primary Amplifier 214 and the Auxiliary Amplifier 215 (the circuit is now configured as the common Wilkinson Power Divider without an internal termination resistor). In the output network, the circuit is configured to function as a combiner. To achieve this, output shunt switch 249 is open and transmission lines 279 and 269 are both set to 70.7Ω.

This network is made up of transmission line that can change impedance between 50 and 70.7Ω and having specific electrical lengths and switches providing ground at specific locations along these transmission lines. The switches are always shunt (to ground) and never in series with the transmission lines. This will prove beneficial for both electrical performance (i.e. insertion loss) and for ease in implementation.

Impedance and electrical lengths as well as the quality of the short circuit connection provided by the switch must be controlled to provide good system impedance match.

Minimum insertion loss is paramount mainly in the output network. This will help system efficiency as well thermal issues due to power dissipation.

It is undesirable for data intended for any one sector to be present at the output port for any other sector. It is primarily the quality of grounding at the shunt switches that influences this parameter.

It can be seen in FIG. 2 that the path lengths between any network input port and any amplifier input are of equal electrical length. Also, the path lengths between any amplifier output and any network output port are of equal electrical length. This is a requirement in this embodiment because in Conditions 5, 6 & 7 the signal is being split and then recombined. These functions require that the signal paths have equal electrical length through all paths. If any additional path length is added during implementation of this circuit, it must be applied in such away that maintains equal length among the different paths.

While there has been illustrated and described what are at present considered to be preferred and alternate embodiments of the present invention, it should be understood and appreciated that modifications may be made by those skilled in the art, and that the appended claims encompass all such modifications that fall within the full spirit and scope of the present invention.

What is claimed is:

1. A high frequency amplifier network for selectively replacing a primary amplifier with an auxiliary amplifier, comprising:
   an auxiliary amplifier having an input and an output;
   at least one primary amplifier circuit, comprising:
      a circuit input;
      a circuit output;
      a primary amplifier, having an input and an output;
      a first transmission line for connecting said circuit input to said primary amplifier's input;
      a second transmission line for connecting said primary amplifier's output to said circuit output;
      a first shunt switch for selectively connecting said primary amplifier's input to ground;
      a second shunt switch for selectively connecting said primary amplifier's output to ground;
      a third shunt switch;
      a third transmission line for connecting said circuit input to said third shunt switch, said third shunt switch for selectively connecting said third transmission line to ground;

a fourth transmission line for connecting said third shunt switch to said auxiliary amplifier's input;
a fourth shunt switch;
a fifth transmission line for connecting said circuit output to said fourth shunt switch, said fourth shunt switch for selectively connecting said fifth transmission line to ground; and
a sixth transmission line for connecting said fourth shunt switch to said auxiliary amplifier's output;
wherein when each of said first and second shunt switches is connected to ground and each of said third and fourth shunt switches is open, said primary amplifier is electronically isolated from said circuit input and said circuit output, and said auxiliary amplifier will operate to amplify a signal present at said circuit input and produce an amplified signal at said circuit output; and
wherein when each of said first and second shunt switches is open and each of said third and fourth shunt switches is connected to ground, said auxiliary amplifier is electronically isolated from said circuit input and said circuit output, and said primary amplifier will operate to amplify a signal present at said circuit input and produce an amplified signal at said circuit output.

2. The high frequency amplifier network of claim 1 wherein each of said transmission lines comprises ¼ a wavelength at an operating frequency selected for said amplifier network and each of said transmission lines presents an impedance of 50 Ω.

3. The high frequency amplifier network of claim 1 wherein said at least one primary amplifier circuit is three primary amplifier circuits.

4. A high frequency amplifier network for selectively replacing a primary amplifier with an auxiliary amplifier, comprising:
an auxiliary amplifier having an input and an output;
three primary amplifier circuit, each primary amplifier circuit comprising:
  a circuit input;
  a circuit output;
  a primary amplifier, having an input and an output;
  a first transmission line for connecting said circuit input to said primary amplifier's input;
  a second transmission line for connecting said primary amplifier's output to said circuit output;
  a first shunt switch for selectively connecting said primary amplifier's input to ground;
  a second shunt switch for selectively connecting said primary amplifier's output to ground;
  a third shunt switch;
  a third transmission line for connecting said circuit input to said third shunt switch, said third shunt switch for selectively connecting said third transmission line to ground;
  a fourth transmission line for connecting said third shunt switch to said auxiliary amplifier's input;
  a fourth shunt switch;
  a fifth transmission line for connecting said circuit output to said fourth shunt switch, said fourth shunt switch for selectively connecting said fifth transmission line to ground; and
  a sixth transmission line for connecting said fourth shunt switch to said auxiliary amplifier's output;
wherein when each of said first and second shunt switches is connected to ground and each of said third and fourth shunt switches is open, said primary amplifier is electronically isolated from said circuit input and said circuit output, and said auxiliary amplifier will operate to amplify a signal present at said circuit input and produce an amplified signal at said circuit output; and
wherein when each of said first and second shunt switches is open and each of said third and fourth shunt switches is connected to ground, said auxiliary amplifier is electronically isolated from said circuit input and said circuit output, and said primary amplifier will operate to amplify a signal present at said circuit input and produce an amplified signal at said circuit output.

5. A high frequency amplifier network with an auxiliary amplifier, comprising:
an auxiliary amplifier having an input and an output;
at least one primary amplifier circuit, comprising:
  a circuit input;
  a circuit output;
  a primary amplifier, having an input and an output;
  a first shunt switch;
  a second shunt switch;
  a third shunt switch;
  a fourth shunt switch;
  a first transmission line for connecting said circuit input to said first shunt switch, said first shunt switch for selectively connecting said first transmission line to ground;
  a second transmission line for connecting said first shunt switch to said primary amplifier's input;
  a third transmission line for connecting said primary amplifier's output to said second shunt switch, said second shunt switch for selectively connecting said third transmission line to ground;
  a fourth transmission line for connecting said second shunt switch to said circuit output;
  a fifth transmission line for connecting said circuit input to said third shunt switch, said third shunt switch for selectively connecting said fifth transmission line to ground;
  a sixth transmission line for connecting said third shunt switch to said auxiliary amplifier's input;
  a seventh transmission line for connecting said auxiliary amplifier's output to said fourth shunt switch, said fourth shunt switch for selectively connecting said seventh transmission line to ground; and
  an eighth transmission line for connecting said fourth shunt switch to said circuit output;
wherein each of said first, fourth, fifth and eighth transmission lines is a selectable transmission line that selectively presents one of two impedances; and
wherein the high frequency amplifier network can be selectively operated in one of the following conditions: said primary amplifier is active and said auxiliary amplifier is inactive, said primary amplifier is inactive and said auxiliary amplifier is active, and said primary amplifier is active and said auxiliary amplifier is active and operates in parallel with said primary amplifier.

6. The high frequency amplifier network of claim 5 wherein each of said transmission lines comprises a ¼ wavelength at an operating frequency selected for said amplifier network and each of said second, third, sixth and seventh transmission lines presents an impedance of 50 Ω.

7. The high frequency amplifier network of claim 5 wherein said at least one primary amplifier circuit is three primary amplifier circuits.

8. A high frequency amplifier network, comprising:
an auxiliary amplifier having an input and an output;
three primary amplifier circuits, each primary amplifier circuit comprising:
  a circuit input;

a circuit output;
a primary amplifier, having an input and an output;
a first shunt switch;
a second shunt switch;
a third shunt switch;
a fourth shunt switch;
a first transmission line for connecting said circuit input to said first shunt switch, said first shunt switch for selectively connecting said first transmission line to ground;
a second transmission line for connecting said first shunt switch to said primary amplifier's input;
a third transmission line for connecting said primary amplifier's output to said second shunt switch, said second shunt switch for selectively connecting said third transmission line to ground;
a fourth transmission line for connecting said second shunt switch to said circuit output;
a fifth transmission line for connecting said circuit input to said third shunt switch, said third shunt switch for selectively connecting said fifth transmission line to ground;
a sixth transmission line for connecting said third shunt switch to said auxiliary amplifier's input;
a seventh transmission line for connecting said auxiliary amplifier's output to said fourth shunt switch, said fourth shunt switch for selectively connecting said seventh transmission line to ground; and
an eighth transmission line for connecting said fourth shunt switch to said circuit output;
wherein each of said first, fourth, fifth and eighth transmission lines is a selectable transmission line that selectively presents one of two impedances; and
wherein the high frequency amplifier network can be selectively operated in one of the following conditions: each of said three primary amplifier circuits is active and said auxiliary amplifier inactive, one of said three primary amplifier circuits is inactive and said auxiliary amplifier is active in place of said one of said three primary amplifier circuits, and one of said three primary amplifier circuits active and said auxiliary amplifier is active in parallel with said one of said three primary amplifier circuits.

9. The high frequency amplifier network of claim 8 in which for one of said three primary amplifier circuits said first and second shunt switches are open and said third and fourth shunt switches are shorted to ground, said first transmission line and said fourth transmission line each present a first characteristic impedance and said fifth transmission line and said eighth transmission line each present a second characteristic impedance such that said at least one of said three primary amplifier circuits is active and said auxiliary amplifier is inactive.

10. The high frequency amplifier network of claim 9 in which said first characteristic impedance is approximately 50 Ω and said second characteristic impedance is approximately 70.7 Ω.

11. The high frequency amplifier network of claim 8 in which for one of said three primary amplifier circuits said first and second shunt switches are shorted to ground and said third and fourth shunt switches are open, said fifth transmission line and said eighth transmission line each present a first characteristic impedance and said first transmission line and said fourth transmission line each present a second characteristic impedance such that said one of said three primary amplifier circuits is inactive and said auxiliary amplifier is active to amplify a signal presented at the input to said one of said three primary amplifier circuits.

12. The high frequency amplifier network of claim 11 in which said first characteristic impedance is approximately 50 Ω and said second characteristic impedance is approximately 70.7 Ω.

13. The high frequency amplifier network of claim 8 in which for one of said three primary amplifier circuits said first, second, third and fourth shunt switches are open, and said first, fourth, fifth and eighth transmission lines each present a first characteristic impedance such that said one of said three primary amplifier circuits is active and said auxiliary amplifier is active and operates in parallel with said one of said three primary amplifier circuits to amplify a signal presented at the input to said one of said three primary amplifier circuits.

14. The high frequency amplifier network of claim 13 in which said first characteristic impedance is approximately 70.7 Ω.

15. The high frequency amplifier network of claim 8, further comprising
a coupled line parallel to each said selectable transmission line and separated from each said selectable transmission line by dielectric, said coupled line further comprising a first port and a second port;
wherein said first port and said second port can be selectively shorted to ground or left open;
wherein for each said selectable transmission line, when said first port and said second port are shorted to ground, the selectable transmission line presents a first characteristic impedance; and
wherein for each said selectable transmission line, when said first port and said second port are open-circuited said selectable transmission line presents a second characteristic impedance.

16. The high frequency amplifier network of claim 15 in which said first characteristic impedance is approximately 50 Ω and said second characteristic impedance is approximately 70.7 Ω.

* * * * *